United States Patent [19]
Doyle et al.

[11] Patent Number: 6,025,254
[45] Date of Patent: Feb. 15, 2000

[54] LOW RESISTANCE GATE ELECTRODE LAYER AND METHOD OF MAKING SAME

[75] Inventors: Brian Doyle, Cupertino; Gang Bai, San Jose, both of Calif.

[73] Assignee: Intel Corporation, Santa Clara, Calif.

[21] Appl. No.: 08/997,038

[22] Filed: Dec. 23, 1997

[51] Int. Cl.[7] .................. H01L 21/283; H01L 21/336
[52] U.S. Cl. .................. 438/592; 438/697; 438/303; 438/655; 438/664
[58] Field of Search .................. 438/230, 303, 438/533, 592, 595, 623, 649, 651, 655, 692, 751, 725, 755, 780, 682, 697, 664; 257/642, 643, 412

[56] References Cited

U.S. PATENT DOCUMENTS

| | | |
|---|---|---|
| 4,948,459 | 8/1990 | Van Laarhoven et al. . |
| 5,139,608 | 8/1992 | Grivna ................... 156/643 |
| 5,334,545 | 8/1994 | Gaviglia . |
| 5,384,285 | 1/1995 | Sitaram et al. ............. 438/655 |
| 5,543,335 | 8/1996 | Zommer ................... 438/533 |
| 5,639,697 | 6/1997 | Weling et al. . |
| 5,731,239 | 3/1998 | Wong et al. ............... 438/533 |
| 5,763,321 | 6/1998 | Ohshima et al. .......... 438/655 |
| 5,786,255 | 6/1998 | Yeh et al. . |
| 5,821,621 | 10/1998 | Jeng ........................ 438/623 |
| 5,851,921 | 12/1998 | Gardner et al. ........... 438/655 |
| 5,861,340 | 1/1999 | Bai et al. ................... 439/592 |

*Primary Examiner*—Savitri Mulpuri
*Attorney, Agent, or Firm*—Raymond J. Werner

[57] ABSTRACT

A MOSFET having a low resistance gate electrode structure includes silicided source and drain regions, and a silicided gate electrode wherein the thickness of the silicide layer superjacent the gate electrode is substantially thicker than the silicide layers overlying the source and drain regions.

A process in accordance with the present invention decouples the silicidation of MOSFET source/drain regions from the silicidation of the gate electrode.

11 Claims, 2 Drawing Sheets

LOW RESISTANCE GATE ELECTRODE LAYER AND METHOD OF MAKING SAME

BACKGROUND OF THE INVENTION

1. Field of the Invention

The present invention relates generally to microelectronic structures and fabrication methods, and more particularly to the formation of a low resistance gate electrode layer.

2. Background

Advances in semiconductor manufacturing technology have led to the development of integrated circuits having smaller and smaller dimensions. Transistor sizes are not the only elements of integrated circuits reaching these smaller dimensions with advancing generations of semiconductor manufacturing processes. In fact, interconnect lines have been shrinking as well, in both height and width.

Interconnect lines are electrically conductive pathways, and are referred to in the field variously as lines, traces, wires, conductors, signal paths and signaling media. These related terms, are generally interchangeable, and appear in order from specific to general. Metal lines, generally aluminum (Al), copper (Cu) or an alloy of Al and Cu, are conductors that provide signal paths for coupling, i.e., interconnecting, electrical circuitry.

However, conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal silicides are examples of other conductors.

As the cross-sectional dimensions of the various interconnect lines shrink, there is a corresponding increase in the electrical resistance of these interconnect lines. This is particularly aggravating for polysilicon lines since the sheet resistance of polysilicon is substantially higher than that of the more commonly used metal interconnects.

Additionally, polysilicon lines are typically used to form the gate electrode of metal oxide semiconductor field effect transistors (MOSFETs). An increase in the electrical resistance of the polysilicon therefore tends to limit the gate width that can be used in high speed circuit designs, since the signal propagation delay resulting from the high resistance of the gate electrode will manifest itself as a transistor that is slow to turn on, and slow to turn off.

Layout techniques, such as segmentation of a MOSFET into several shorter legs to achieve a given electrical gate width while reducing propagation delay, have been used, but these have their own drawbacks such as consuming more chip area. Similarly, silicide layers have been formed on polysilicon gate electrodes but the resistance of even these multi-layer gate electrodes remains higher than desirable.

What is needed is a structure that provides low resistance gate electrodes, and methods of making such a structure.

SUMMARY OF THE INVENTION

Briefly, a MOSFET having a low resistance gate electrode structure includes a silicided gate electrode wherein the thickness of the silicide layer superjacent a polysilicon gate electrode layer is substantial in comparison to the polysilicon.

In one particular embodiment of the present invention, a MOSFET having a low resistance gate electrode structure includes silicided source and drain regions, and a silicided gate electrode wherein the thickness of the silicide layer superjacent the gate electrode is substantially thicker than the silicide layers overlying the source and drain regions.

A process in accordance with the present invention decouples the silicidation of MOSFET source/drain regions from the silicidation of the gate electrode by using a sacrificial dielectric layer to isolate the silicided source/drain regions from additional silicide processing.

BRIEF DESCRIPTION OF THE DRAWINGS

FIG. 1(*b*) is a schematic cross-section of the MOSFET of FIG. 1(*a*) with a low dielectric constant sacrificial layer deposited thereon.

FIG. 1(*c*) is a schematic cross-section of the MOSFET of FIG. 1(*b*) showing the sacrificial layer, has been polished back to expose the silicide layer, and a layer of conductive material has been deposited thereon.

FIG. 1(*d*) is a schematic cross-section of the MOSFET of FIG. 1(*c*) showing the newly formed thick silicide layer over the gate electrode and the unreacted conductive material removed.

FIG. 1(*e*) is a schematic cross-section of the MOSFET of FIG. 1(*d*) showing the structure of the present invention after the removal of the sacrificial layer.

DETAILED DESCRIPTION

Overview

Figure 1A:
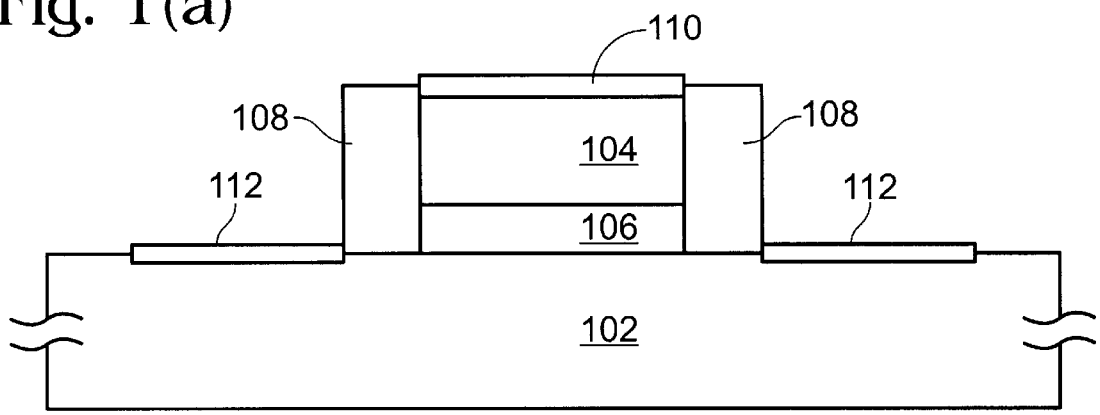
FIG. 1(*a*) is a schematic cross-section of a MOSFET having sidewall spacers, a silicided gate electrode and silicided source and drain regions.
Figure 1B:
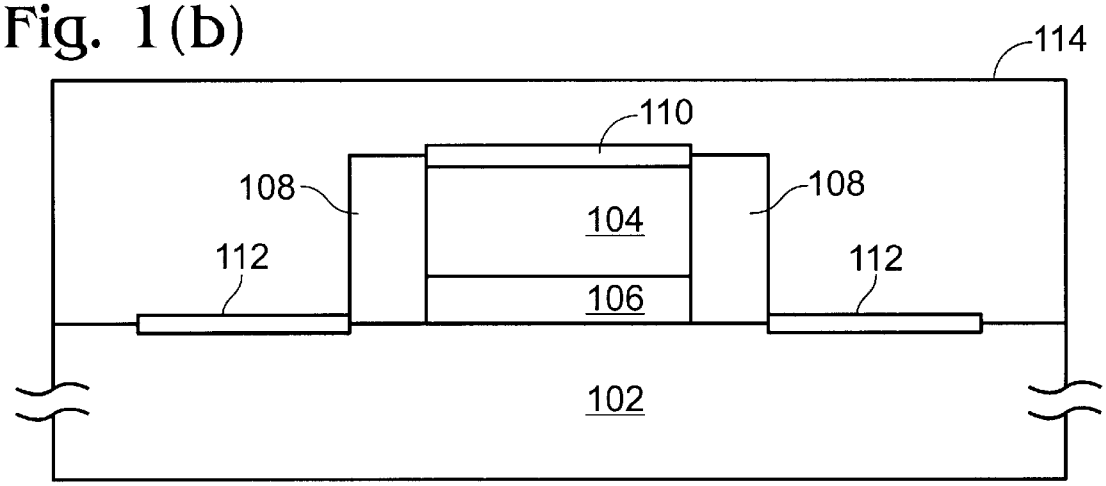

Embodiments of the present invention substantially reduce the gate resistance component of RC delays in transistors. One method in accordance with the present invention utilizes a sacrificial dielectric layer which is polished back to the gate level, thereby opening up the gate electrode to further silicide processing, while simultaneously protecting the source/drain regions.

Method

An exemplary method of forming a low resistance gate electrode, in accordance with the present invention is described below in conjunction with FIGS. 1(*a*)–(*e*).

FIG. 1(*a*), illustrates a semiconductor manufacturing process up through the point of having formed a MOSFET having sidewall spacers, silicided source/drain regions and a silicided gate electrode. As can be seen in FIG. 1(a), a substrate 102 has formed thereon a gate insulation layer 106, typically an oxide layer. Substrate 102 is typically a semiconductor, such as a silicon wafer. A gate electrode layer 104, is formed of polysilicon. Sidewall spacers 108 are formed adjacent to gate electrode layer 104. Source/drain silicide layer 112 and gate silicide layer 110 are formed concurrently. Typically, an implantation of impurities to form the source and drain junctions (not shown) takes place prior to the formation of source/drain silicide layer 112. The structure shown in FIG. 1(*a*) represents conventional fabrication well understood by those skilled in the art.

FIG. 1(*b*) shows the deposition of a sacrificial dielectric layer 114 in accordance with the present invention. Sacrificial dielectric layer 114 is typically a low dielectric constant material, such as an organic polymer. Organic polymer dielectrics are well-known in this field, but are typically used as part of an inter-layer dielectric structure. The expression, low dielectric constant material, as used herein refers to materials having a lower dielectric constant than oxides of silicon. A desirable characteristic of sacrificial dielectric layer 114 is that it be selectively etchable. That is, in order to remove sacrificial dielectric layer 114 without substantially disturbing any other structure, the etch rate of sacrificial dielectric layer 114 should be substantially higher than the etch rate of other materials, such as nickel silicide, silicon nitride, silicon oxide and the like, that may be encountered during the removal etch. Choosing materials for high etch selectivity is well-known in this field.

Figure 1C:
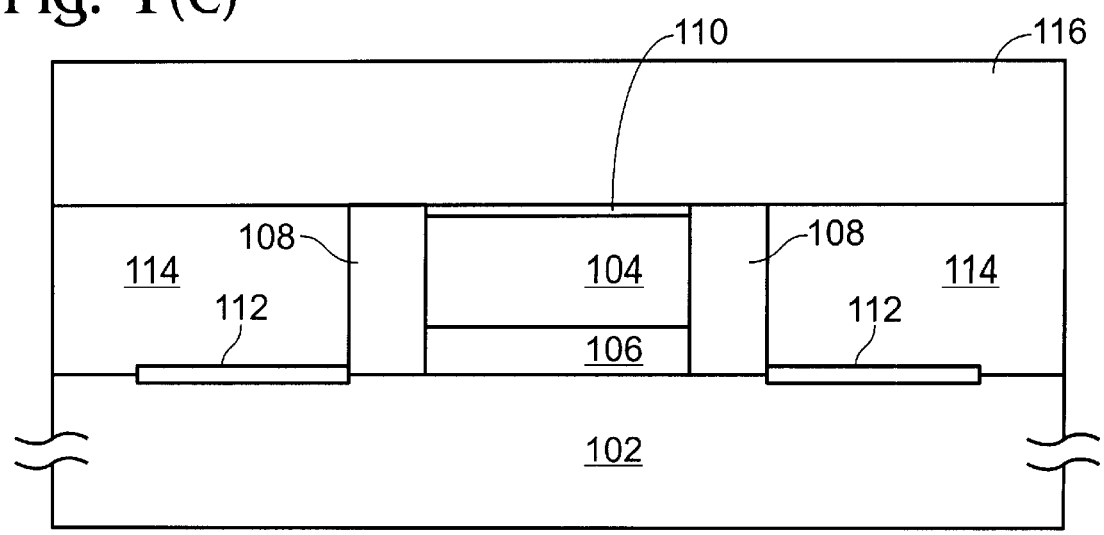

As shown in FIG. 1(c), sacrificial dielectric layer 114 is then processed to remove an uppermost portion in order to expose the top surface of the gate electrode. Typically, the top portion of sacrificial layer 114 is removed by chemical mechanical polishing (CMP). It will be appreciated by those skilled in the art having the benefit of this disclosure that the top portion of a sacrificial layer may also be etched back. A layer of nickel 116 is then deposited. Nickel is used because nickel silicides can be formed at temperatures low enough to be compatible with the sacrificial layer. Other materials choices for the sacrificial layer and silicide can be made, however they must be compatible with each other from a processing standpoint, Of course, relatively low temperature processing is desirable so as to reduce thermal diffusion of implanted impurities.

Figure 1D:
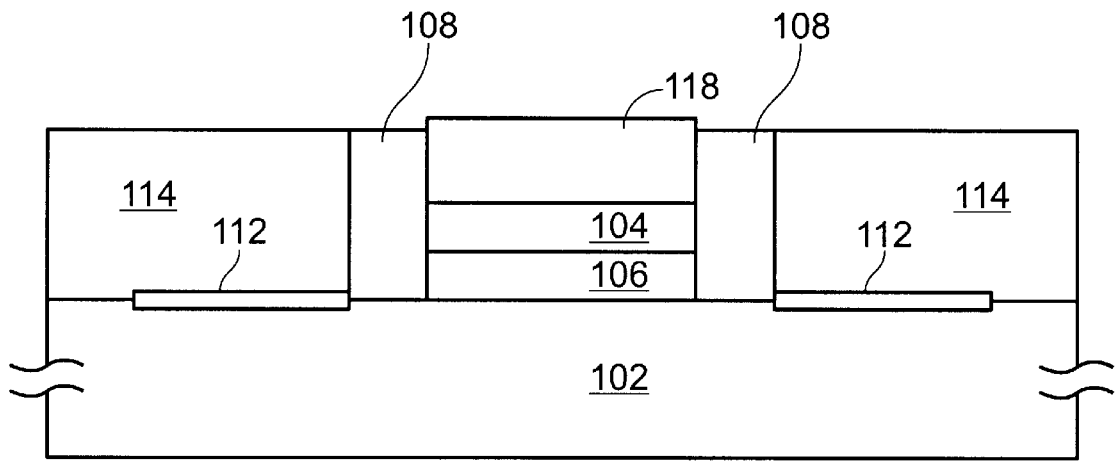

As shown in FIG. 1(d), nickel layer 116 is then reacted, typically by heating, with the underlying polysilicon to form a new silicide layer 118 that is substantially thicker than silicide layer 110. As further shown in FIG. 1(d), silicide layer 118 is also substantially thicker than source/drain silicide layers 112. Sacrificial layer 114 protects source/drain silicide layers 112 from the silicide processing performed on the gate electrode.

The unreacted nickel and sacrificial dielectric layer 114 are then removed, and well-known processing steps, such as the formation of inter-layer dielectrics, contacts, vias and multiple levels of metal interconnect, are then performed to complete the integrated circuit.

Structure

Figure 1E:
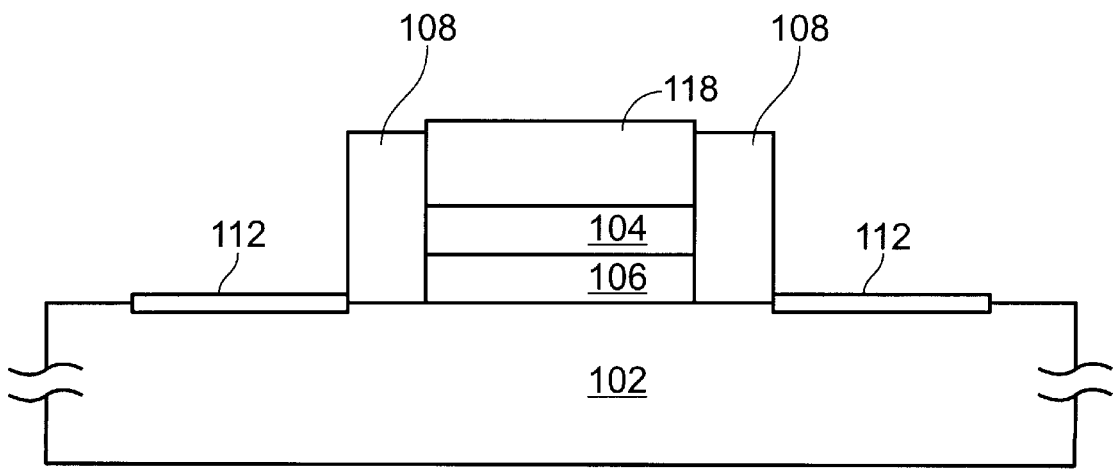

A heavily silicided, low resistance polysilicon line in accordance with the present invention is shown in cross-section in FIG. 1(e). The silicided polysilicon line in FIG. 1(e) forms a gate electrode.

Conclusion

Embodiments of the present invention provide, a low resistance gate electrode structure on integrated circuits.

An advantage of embodiments of the present invention is that resistance in polysilicon lines is reduced as compared to conventional silicided polysilicon lines.

A further advantage of embodiments of the present invention is that gate width constraints for high speed circuit designs can be relaxed.

A still further advantage of embodiments of the present invention is that low resistance polysilicon lines may be used for signal transmission and not just gate electrodes.

The present invention may be implemented with various changes and substitutions to the illustrated embodiments. For example, the present invention may be implemented with various metals that form suicides when reacted with polysilicon. Furthermore, the source/drain silicides may be formed from different metals than the silicide on the polysilicon. In alternative embodiments, it is not a requirement of the present invention that the source/drain regions be silicided. Similarly, it is not a requirement of the present invention that sidewall spacers be part of the MOSFET structure.

It will be readily understood by those skilled in the art that various other changes in the details, materials, and arrangements of the parts and steps which have been described and illustrated in order to explain the nature of this invention may be made without departing from the principles and scope of the invention as expressed in the subjoined claims.

What is claimed is:

1. A method of forming a low resistance gate electrode structure comprising:

forming an insulating layer on a semiconductor substrate;

forming a gate electrode over the insulating layer, the gate electrode having sidewall spacers; implanting impurities to form a source region and a drain region;

depositing a first conductive material over the substrate;

reacting the conductive material to form silicided source and drain regions, and a silicide layer having a first thickness on the gate electrode;

depositing a low dielectric constant sacrificial layer over the substrate; removing an uppermost portion of the sacrificial layer until the suicide layer is exposed;

depositing a second conductive material over both the sacrificial layer and the silicide layer;

forming a silicide layer having a second thickness;

removing the unreacted conductive material; and removing the remaining low dielectric constant sacrificial layer.

2. The method of claim 1, wherein the second thickness is greater than the first thickness.

3. The method of claim 1, wherein the first and second conductive materials are different.

4. The method of claim 1, wherein the second conductive material is nickel.

5. The method of claim 1, wherein the low dielectric constant sacrificial layer comprises an organic polymer.

6. The method of claim 1, wherein removing an uppermost portion of the sacrificial layer comprises chemical mechanical polishing.

7. The method of claim 1, wherein removing an uppermost portion of the sacrificial layer comprises etching.

8. A method of forming a low resistance gate electrode structure comprising:

forming an insulating layer on a semiconductor substrate;

forming a gate electrode over the insulating layer, the gate electrode having sidewall spacers;

implanting impurities to form a source region and a drain region;

depositing a first conductive material over the substrate;

reacting the conductive material to form silicided source and drain regions, and a silicide layer having a first thickness on the gate electrode;

depositing a sacrificial layer over the substrate; removing an uppermost portion of the sacrificial layer until the silicide layer is exposed;

depositing a second conductive material over both the sacrificial layer and the silicide layer;

forming a silicide layer having a second thickness; removing the unreacted conductive material; and removing the remaining sacrificial layer.

9. The method of claim 8, wherein the sacrificial layer comprises a low dielectric constant material.

10. The method of claim 8, wherein removing an uppermost portion of the sacrificial layer comprises etching.

11. The method of claim 8, wherein the second thickness is greater than the first thickness.

* * * * *

UNITED STATES PATENT AND TRADEMARK OFFICE
CERTIFICATE OF CORRECTION

| | | |
|---|---|---|
| PATENT NO. | : 6,025,254 | Page 1 of 1 |
| APPLICATION NO. | : 08/997038 | |
| DATED | : February 15, 2000 | |
| INVENTOR(S) | : Doyle et al. | |

It is certified that error appears in the above-identified patent and that said Letters Patent is hereby corrected as shown below:

In column 3, at line 58, delete "suicides" and insert --silicides--.

In column 4, at line 19, delete "suicide" and insert --silicide--.

Signed and Sealed this

Seventeenth Day of July, 2007

JON W. DUDAS
*Director of the United States Patent and Trademark Office*